(12) United States Patent
Lim et al.

(10) Patent No.: US 8,053,805 B2
(45) Date of Patent: Nov. 8, 2011

(54) LIGHT EMITTING DEVICE, LIGHT EMITTING DEVICE AND PACKAGE, AND LIGHTING SYSTEM

(75) Inventors: Woo Sik Lim, Seoul (KR); Sung Kyoon Kim, Seoul (KR); Sung Ho Choo, Seoul (KR); Byeong Kyun Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/964,454

(22) Filed: Dec. 9, 2010

(65) Prior Publication Data
US 2011/0140161 A1   Jun. 16, 2011

(30) Foreign Application Priority Data
Dec. 11, 2009   (KR) .................. 10-2009-0123005

(51) Int. Cl.
*H01L 33/38* (2010.01)
(52) U.S. Cl. .................. 257/99; 257/E33.065
(58) Field of Classification Search .................. 257/99, 257/E33.065
See application file for complete search history.

(56) References Cited

U.S. PATENT DOCUMENTS

| | | | |
|---|---|---|---|
| 6,518,598 B1* | 2/2003 | Chen ............................. | 257/91 |
| 6,621,102 B2* | 9/2003 | Hirakata et al. ............... | 257/72 |
| 6,958,498 B2* | 10/2005 | Shelton et al. ................ | 257/99 |
| 7,227,607 B2* | 6/2007 | Lee ............................... | 349/141 |
| 7,382,431 B2* | 6/2008 | Lee ............................... | 349/141 |
| 7,528,920 B2* | 5/2009 | Lee et al. ....................... | 349/141 |
| 7,714,340 B2* | 5/2010 | Chua et al. ..................... | 257/98 |
| 7,763,898 B2* | 7/2010 | Tanaka et al. .................. | 257/87 |
| 7,902,548 B2* | 3/2011 | Lim et al. ....................... | 257/48 |
| 7,935,979 B2* | 5/2011 | Shum et al. .................... | 257/99 |
| 2004/0012013 A1 | 1/2004 | Katayama | |
| 2005/0104081 A1* | 5/2005 | Kim et al. ....................... | 257/99 |
| 2005/0161779 A1* | 7/2005 | Peng et al. ..................... | 257/678 |
| 2008/0035944 A1* | 2/2008 | Eberhard et al. ................ | 257/98 |
| 2008/0048172 A1* | 2/2008 | Muraki et al. .................. | 257/13 |
| 2008/0230791 A1* | 9/2008 | Lin et al. ........................ | 257/91 |
| 2009/0213307 A1* | 8/2009 | Chiu et al. ..................... | 349/104 |
| 2009/0283768 A1* | 11/2009 | Wang et al. .................... | 257/59 |
| 2010/0096725 A1* | 4/2010 | Shi et al. ....................... | 257/531 |
| 2010/0155742 A1* | 6/2010 | Takeuchi et al. ............... | 257/77 |
| 2010/0295088 A1* | 11/2010 | D'Evelyn et al. .............. | 257/99 |

FOREIGN PATENT DOCUMENTS

| | | |
|---|---|---|
| KR | 10-0765903 | 10/2007 |
| KR | 10-2008-0042340 | 5/2008 |
| WO | WO 2004/112157 | 12/2004 |

OTHER PUBLICATIONS

Korean Notice of Allowance dated Jul. 7, 2010 issued in Application No. 10-2009-0123005.

* cited by examiner

*Primary Examiner* — George Fourson, III
(74) *Attorney, Agent, or Firm* — KED & Associates, LLP (57) ABSTRACT

Provided are a light emitting device, a light emitting device package, and a lighting system. The light emitting device comprises a light emitting structure layer comprising a first conductive type semiconductor layer, a second conductive type semiconductor layer, and an active layer between the first conductive type semiconductor layer and the second conductive type semiconductor layer, and an electrode comprising a pad part and a finger part on the light emitting structure layer. The pad part comprises a pattern in which at least one opening is defined, and the finger part comprises a pattern electrically connected to the pad part and linearly extending from the pad part.

5 Claims, 8 Drawing Sheets

LIGHT EMITTING DEVICE, LIGHT EMITTING DEVICE AND PACKAGE, AND LIGHTING SYSTEM

CROSS-REFERENCE TO RELATED APPLICATIONS

The present application claims priority under 35 U.S.C. §119(a) of Korean Patent Application No. 10-2009-0123005 filed on Dec. 11, 2009, which is hereby incorporated by reference in its entirety.

BACKGROUND

Embodiments relate to a light emitting device, a light emitting device package, and a lighting system.

Light emitting diodes (LED) are semiconductor devices that convert current into light.

A wavelength of light emitted from the respective LEDs is varied according to a semiconductor material used for manufacturing the LED. This is done because a wavelength of the emitted light depends on a band-gap of semiconductor material. The respective band-gaps represent an energy difference between a valence band electrons and conduction band electrons.

As luminance of LEDs is increased recently, the LEDs are being used as light sources for displays, vehicles, and illuminations. Also, LEDs emitting highly efficient white light may be realized by using a fluorescent substance or combining LEDs having various colors.

SUMMARY

Embodiments provide a light emitting device having a new structure, a light emitting device package, and a lighting system.

Embodiments also provide a light emitting device having a coupling force improved between an electrode and an electrode pad, a light emitting device package, and a lighting system.

In one embodiment, a light emitting device comprises: a light emitting structure layer comprising a first conductive type semiconductor layer, a second conductive type semiconductor layer, and an active layer; and an electrode comprising a pad part and a finger part on the light emitting structure layer, wherein the pad part comprises a pattern in which at least one opening is defined, and the finger part comprises a pattern electrically connected to the pad part and linearly extending from the pad part.

In another embodiment, a light emitting device package comprises: a package body; first and second electrode layers on the package body, the first and second electrode layers being electrically separated from each other; a light emitting device on the package body, the light emitting device being electrically connected to the first and second electrode layers; and a molding member surrounding the light emitting device on the main body, wherein the light emitting device comprises: a light emitting structure layer comprising a first conductive type semiconductor layer, a second conductive type semiconductor layer, and an active layer; and an electrode comprising a pad part and a finger part on the light emitting structure layer, wherein the pad part comprises a pattern in which at least one opening is defined, and the finger part comprises a pattern electrically connected to the pad part and linearly extending from the pad part, wherein the light emitting device comprises an electrode pad on the pad part.

In further another embodiment, a lighting system using a light emitting device as a light source comprises: a substrate; and at least one light emitting device on the substrate, wherein the light emitting device comprises: a light emitting structure layer comprising a first conductive type semiconductor layer, a second conductive type semiconductor layer, and an active layer between the first conductive type semiconductor layer and the second conductive type semiconductor layer; and an electrode comprising a pad part and a finger part on the light emitting structure layer, wherein the pad part comprises a pattern in which at least one opening is defined, and the finger part comprises a pattern electrically connected to the pad part and linearly extending from the pad part.

The details of one or more embodiments are set forth in the accompanying drawings and the description below. Other features will be apparent from the description and drawings, and from the claims.

DETAILED DESCRIPTION OF THE EMBODIMENTS

In the descriptions of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, a light emitting device, a light emitting device package, and a lighting system according to embodiments will be described with reference to accompanying drawings.

A light emitting device includes a light emitting structure layer including a first conductive type semiconductor layer, an active layer, and a second conductive type semiconductor layer. The first conductive type semiconductor layer and the second conductive type semiconductor layer are electrically connected to electrodes for applying a power source.

The first conductive type semiconductor layer may be an N-type semiconductor layer, and the second conductive type semiconductor layer may be a P-type semiconductor layer. On the other hand, the first conductive type semiconductor layer may be the P-type semiconductor layer, and the second conductive type semiconductor layer may be the N-type semiconductor layer.

The light emitting device may include a lateral type light emitting device in which the whole electrodes are exposed to an upward direction of the light emitting structure layer and a vertical type light emitting device in which one of the electrodes is exposed to the upward direction of the light emitting structure layer and the other one is exposed to a downward direction of the light emitting structure layer.

In the light emitting device, the electrodes are disposed on the light emitting structure layer to allow current applied from a wire-bonded electrode pad to widely flow into the semiconductor layer.

Figure 1:
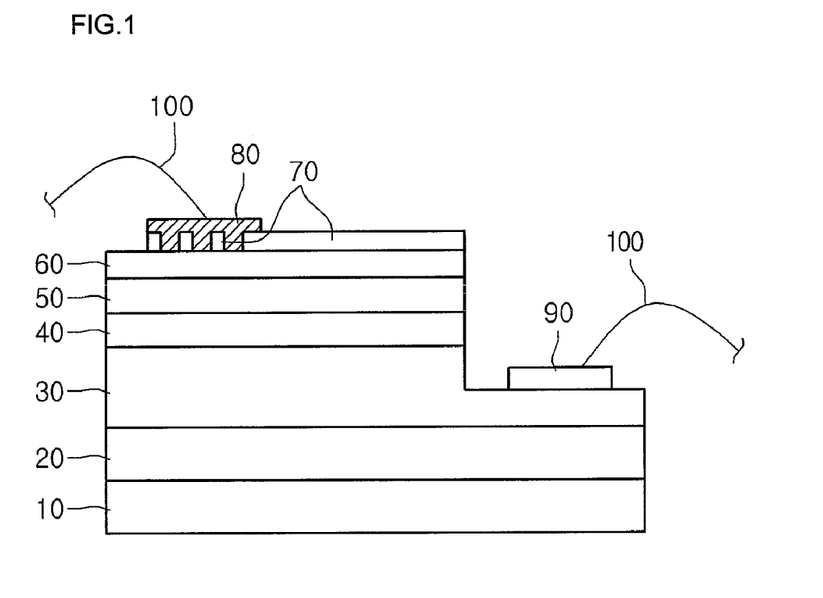
FIGS. 1 to 3 are views of a light emitting device according to embodiments.
Figure 2:
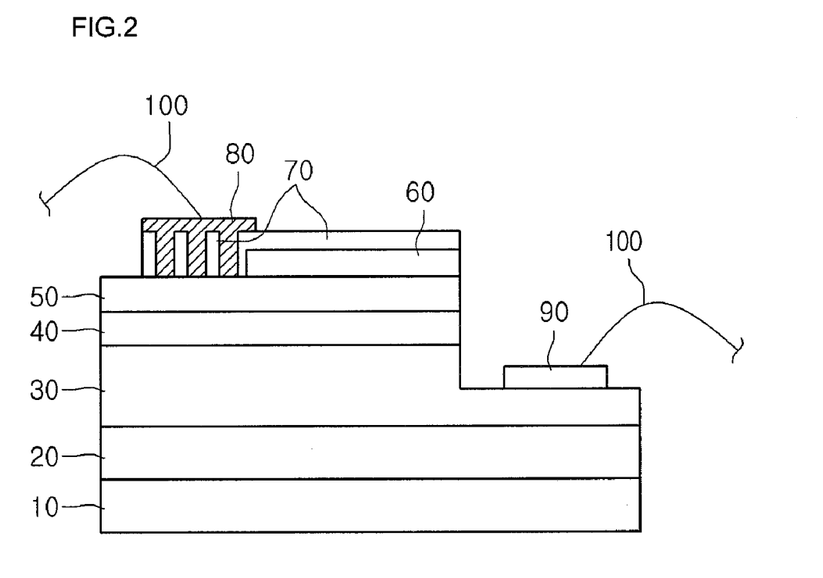
Figure 3:
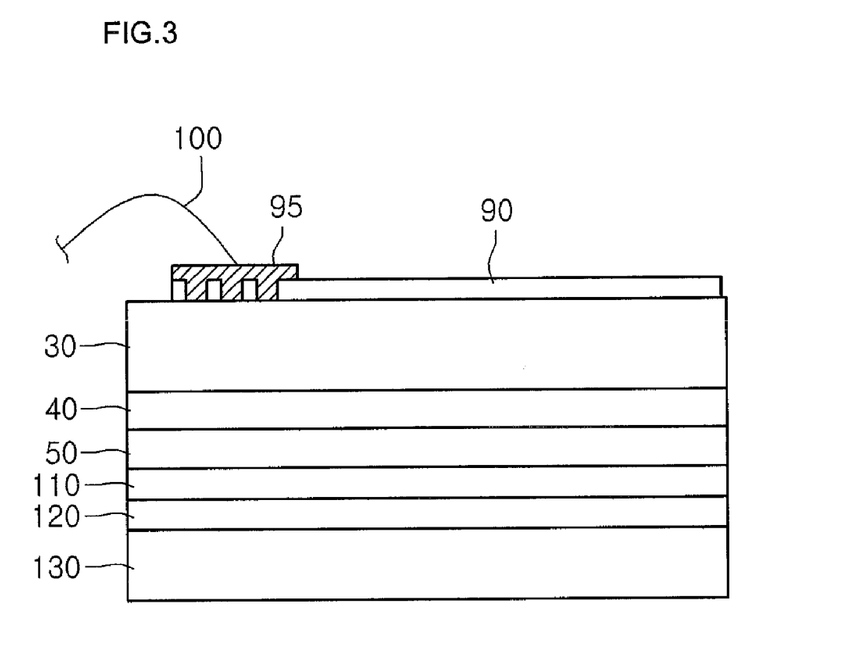

FIGS. 1 to 3 are views of a light emitting device according to embodiments.

Referring to FIG. 1, a light emitting device includes an un-doped nitride layer 20 including a buffer layer disposed on a growth substrate 10, a light emitting structure layer including a first conductive type semiconductor layer 20, an active layer 40, and a second conductive type semiconductor layer 50, which are disposed on the un-doped nitride layer 20, a transparent electrode layer 60 disposed on the second conductive type semiconductor layer 50, a first electrode 90 disposed on the first conductive type semiconductor layer 30, a second electrode disposed on the transparent electrode layer 60, and an electrode pad 80 disposed on the second electrode 70.

The growth substrate 10 may be formed of one of sapphire ($Al_2O_3$), Si, SiC, GaAS, ZnO, or MgO. For example, a sapphire substrate may be used as the growth substrate 10.

The un-doped nitride layer 20 may include a GaN-based semiconductor layer. For example, an un-doped GaN layer grown by injecting trimethylgallium (TMGa) gas together with hydrogen gas and ammonia gas into a chamber may be used as the un-doped nitride layer.

For example, the first conductive type semiconductor layer 30 may include an N-type semiconductor layer. The first conductive type semiconductor layer 30 may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., InAlGaN, GaN, AlGaN, AlInN, InGaN, AlN, or InN, and doped with an N-type dopant such as Si, Ge, and Sn.

The active layer 40 is a layer in which electrons (or holes) injected through the first conductive type semiconductor layer 30 meets with electrons (holes) injected through the second conductive type semiconductor layer 50 to emit light by a band gap difference of an energy band depending on a formation material of the active layer 40.

The active layer 40 may have a single quantum well structure, a multi quantum well (MQW) structure, a quantum dot structure, or a quantum wire structure, but is not limited thereto.

The active layer 40 may be formed of a semiconductor material having a compositional formula of $In_xAl_yGa_{1-x-y}N$ ($0 \leq x \leq 1$, $0 \leq y \leq 1$, $0 \leq x+y \leq 1$). When the active layer 40 has the MQW structure, a plurality of well layers and a plurality of barrier layers may be stacked to form the active layer 40. For example, the active layer 40 may have a stacked structure of InGaN well layer/GaN barrier layer.

A clad layer (not shown) in which an N-type or P-type dopant is doped may be disposed on/under the active layer 40. The clad layer (not shown) may be realized by an AlGaN layer or an InAlGaN layer.

For example, the second conductive type semiconductor layer 50 may be realized by a P-type semiconductor layer. The second conductive type semiconductor layer 50 may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., InAlGaN, GaN, AlGaN, AlInN, InGaN, AlN, or InN, and doped with a P-type dopant such as Mg, Zn, Ca, Sr, and Ba.

The first conductive type semiconductor layer 30 may include the P-type semiconductor layer, and the second conductive type semiconductor layer 50 may include the N-type semiconductor layer. Also, a third conductive type semiconductor layer (not shown) including an N-type or P-type semiconductor layer may be disposed on the second conductive type semiconductor layer 50. Thus, the light emitting structure layer may have at least one of an np junction structure, a pn junction structure, an npn junction structure, or a pnp junction structure. Also, impurities may be doped into the first conductive type semiconductor layer 30 and the second conductive type semiconductor layer 50 with uniform or ununiform concentration. That is, the light emitting structure layer 50 may have various structures, but is not limited thereto.

The light emitting structure layer including the first conductive type semiconductor layer 30, the active layer 40, and the second conductive type semiconductor layer 50 may have various structures, but is not limited to the structure of the light emitting structure layer exemplified in the embodiment.

The transparent electrode layer 60 is disposed between the second conductive type semiconductor layer 50 and the second electrode 70 to serve as an ohmic contact layer. For example, the transparent electrode layer 60 may be formed of at least one of ITO, ZnO, $RuO_x$, $TiO_x$, or $IrO_x$.

It is not necessary that the transparent electrode layer 60 is provided. The second electrode 70 may be directly disposed on the second conductive type semiconductor layer 50. Also, a material serving as the other ohmic contact layer instead of the transparent electrode layer 60 may be formed.

The second electrode 70 may have a predetermined pattern shape, and the electrode pad 80 is disposed on the second electrode 70. The pattern of the second electrode 70 will be described later.

Also, although the second electrode 70 has the predetermined pattern shape, the electrode pad 80 is disposed on the second electrode 70, and the electrode pad 80 is connected to an external power source through a wire in the present embodiment, the above-described structure, may also be applied to the first electrode 90.

Since the second electrode 70 has the predetermined pattern in the present embodiment, one portion of the electrode pad 80 contacts the transparent electrode layer 60, and the other portion of the electrode pad 80 contacts the second electrode 70.

Since a contact area between the electrode pad 80 and the second electrode 70 is increased by the pattern of the second electrode 70, a coupling force between the electrode pad 80 and the second electrode 70 may be increased.

A light emitting device of FIG. 2 has a structure similar to that of the light emitting device of FIG. 1. Thus, descriptions overlapping with FIG. 1 will be omitted.

Referring to FIG. 2, the transparent electrode layer is partially disposed on the second conductive type semiconductor layer 50, and the second electrode 70 is disposed on the second conductive type semiconductor layer 50 and the transparent electrode layer 60.

The second electrode 70 has the predetermined pattern, and the second conductive type semiconductor layer 50 is partially exposed upward by the pattern of the second electrode 70. The electrode pad 80 is disposed on the second electrode 70, and a portion of the electrode pad 80 contacts the second conductive type semiconductor layer 50.

Since a contact area between the second electrode 70 and the electrode pad 80 is increased by the pattern of the second electrode 70, a coupling force between the electrode pad 80 and the second electrode 70 may be increased.

A light emitting device of FIG. 3 includes a vertical type light emitting device, unlike the lateral type light emitting device of FIGS. 1 and 2.

Referring to FIG. 3, a light emitting device includes a reflective layer 120 on a conductive support substrate 130, an ohmic contact layer 110 on the reflective layer 120, a second conductive type semiconductor layer 50 on the ohmic contact layer 110, an active layer 40 on the second conductive type semiconductor layer 50, a first conductive type semiconductor layer 30 on the active layer 40, a first electrode 90 on the first conductive type semiconductor layer 30, and an electrode pad 95 on the first electrode 90.

The first electrode 90 has a predetermined pattern, and a portion of the first conductive type semiconductor layer 30 is partially exposed upward by the pattern. The electrode pad 95 connected to a wire 100 is disposed on the first electrode 90, and a portion of the electrode pad 95 contacts the first conductive type semiconductor layer 30.

Since a contact area between the first electrode 90 and the electrode pad 95 is increased by the pattern of the first electrode 90, a coupling force between the electrode pad 95 and the first electrode 90 may be increased.

As illustrated in FIGS. 1 to 3, the light emitting device according to the embodiment includes the electrode for applying the power source. Also, the electrode has the predetermined pattern to increase the coupling force between the electrode and the electrode pad.

Figure 4:
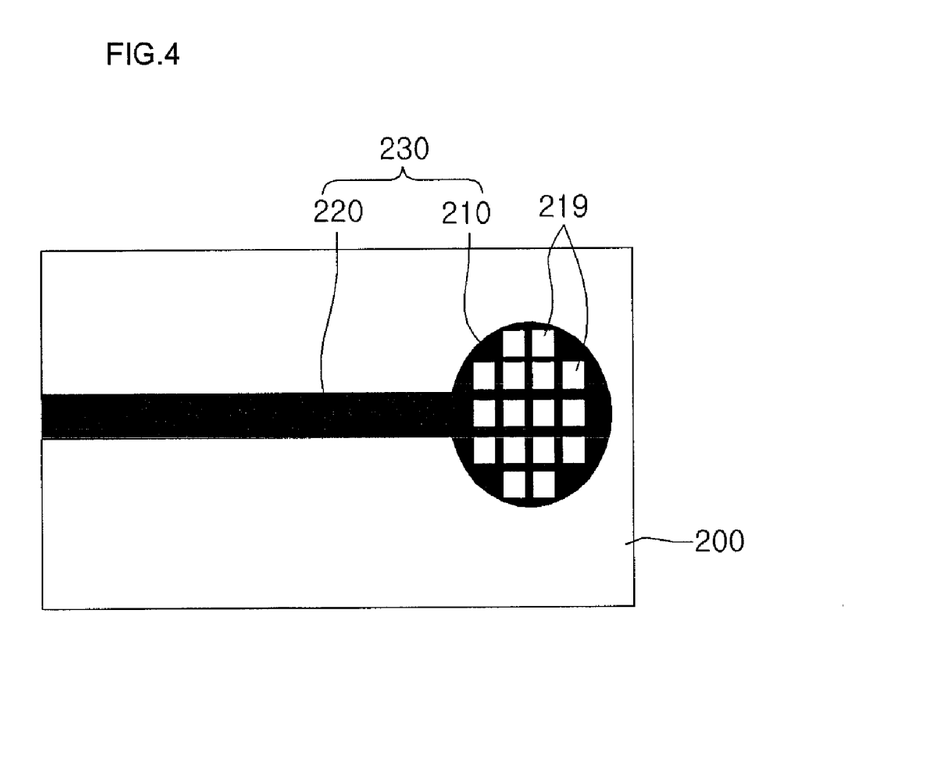
FIG. 4 is a view illustrating an electrode of a light emitting device according to a first embodiment.

FIG. 4 is a view illustrating an electrode of a light emitting device according to a first embodiment.

Referring to FIG. 4, an electrode 230 including a pad part 210 and a finger part 220 is disposed on a conductive layer 200.

The conductive layer 200 may be a layer for supplying a power source to a first conductive type semiconductor layer or a second, conductive type semiconductor layer. That is, the conductive layer 200 may be a portion of a light emitting structure layer or a layer electrically connected to the light emitting structure layer. For example, the conductive layer 200 may include one of the first conductive type semiconductor layer, the second conductive type semiconductor layer, and a transparent electrode layer.

The pad part 210 has an approximately circular plate-shaped pattern. The finger part 220 is connected to the pad part 210 and has a pattern linearly extending from the pad part 210. At least one opening 219 is defined in the pad part 210 to upwardly expose the conductive layer 200 through the opening 219. According to the present embodiment, a plurality of openings 219 is defined in the pad part 210.

As illustrated in FIGS. 1 to 3, the electrode pad 80 is disposed on the pad part 210. A contact area between an electrode pad 80 and the pad part 210 is increased by the pattern of the pad part 210 to improve a coupling force therebetween.

Figure 5:
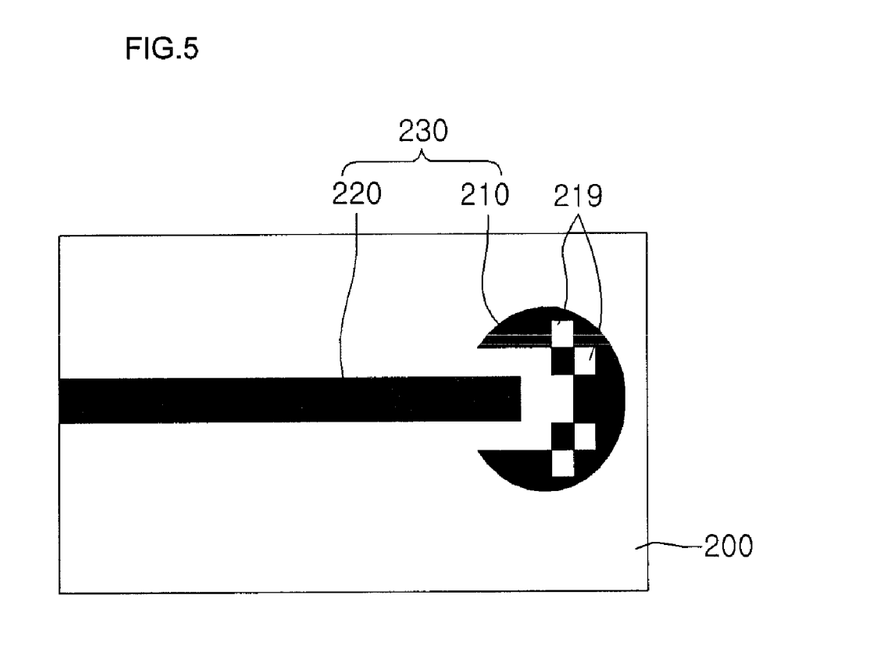
FIG. 5 is a view illustrating an electrode of a light emitting device according to a second embodiment.

FIG. 5 is a view illustrating an electrode of a light emitting device according to a second embodiment.

In descriptions of the second embodiment, descriptions overlapping with the first embodiment described above will be omitted.

Referring to FIG. 5, an electrode 230 including a pad part 210 and a finger part 220 is disposed on a conductive layer 200.

The pad part 210 has an approximately circular plate-shaped pattern. The finger part 220 is spaced from the pad part 210 and has a linearly extending pattern. The finger part 220 and the pad part 210 are electrically connected to each other through the conductive layer 200. A plurality of openings 219 is defined in the pad part 210 to upwardly expose the conductive layer 200 through the openings 219.

As illustrated in FIGS. 1 to 3, the electrode pad 80 is disposed on the pad part 210. A contact area between the electrode pad 80 and the pad part 210 is increased by the pattern of the pad part 210 to improve a coupling force therebetween.

Figure 6:
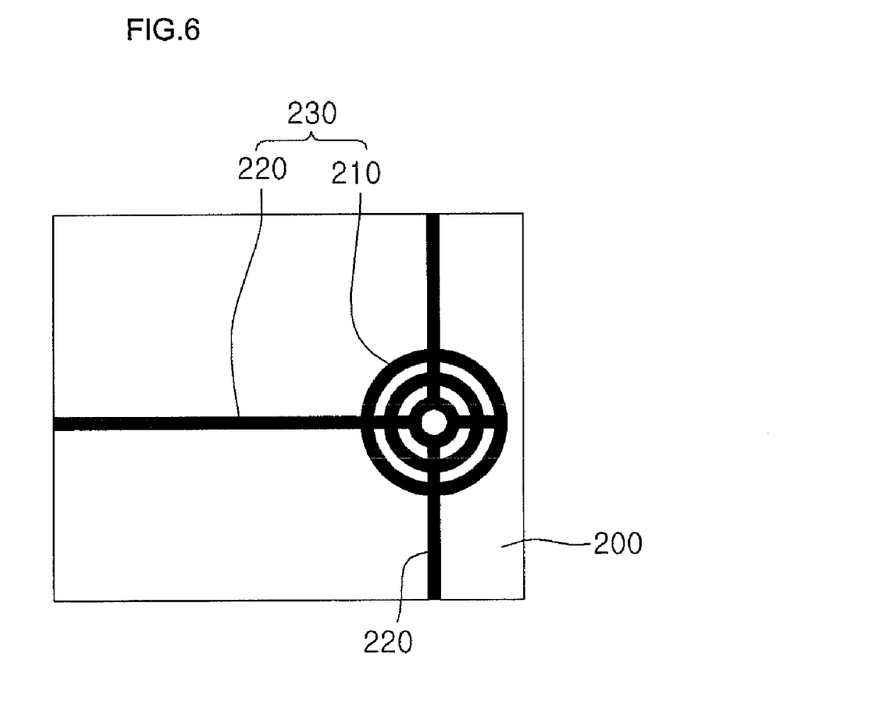
FIG. 6 is a view illustrating an electrode of a light emitting device according to a third embodiment.

FIG. 6 is a view illustrating an electrode of a light emitting device according to a third embodiment.

In descriptions of the third embodiment, descriptions overlapping with the first embodiment described above will be omitted.

Referring to FIG. 6, an electrode 230 including a pad part 210 and a finger part 220 is disposed on a conductive layer 200.

The pad part 210 has a pattern having a concentric circle shape, and the finger part 220 is connected to the pad part 210 and has a pattern linearly extending from the pad part 210. The pad part 210 has a shape in which a plurality of concentric circle-shaped patterns connected to each other is arranged, and the pad part 210 and the finger part 220 have the same pattern width as each other.

In the present embodiment, the finger part 220 is provided in plurality, and at least one extends from the pad part 210 in a direction in which the at least one is at right angles to the other one.

The pad part 210 includes openings between the plurality of patterns having the concentric circle shape to upwardly expose the conductive layer 200 through the openings.

As illustrated in FIGS. 1 to 3, the electrode pad 80 is disposed on the pad part 210. A contact area between the electrode pad 80 and the pad part 210 is increased by the pattern of the pad part 210 to improve a coupling force therebetween.

Figure 7:
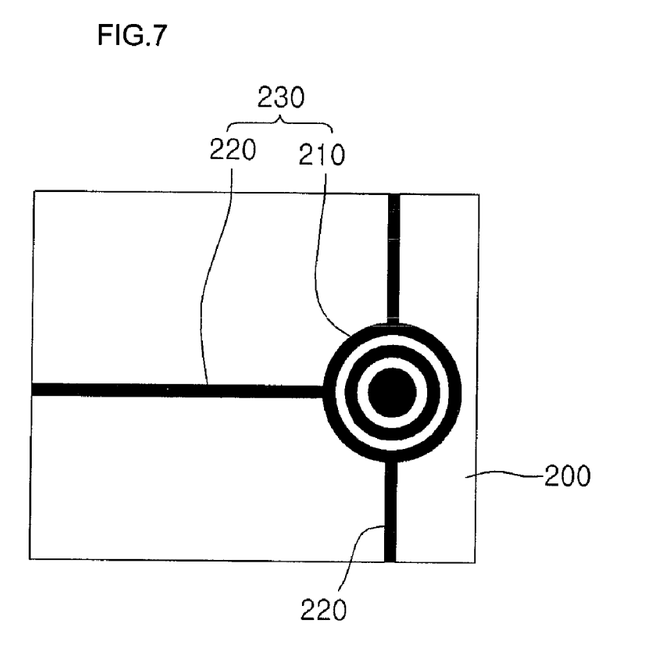
FIG. 7 is a view illustrating an electrode of a light emitting device according to a fourth embodiment.

FIG. 7 is a view illustrating an electrode of a light emitting device according to a fourth embodiment.

In descriptions of the fourth embodiment, descriptions overlapping with the first embodiment described above will be omitted.

Referring to FIG. 7, an electrode 230 including a pad part 210 and a finger part 220 is disposed on a conductive layer 200.

The pad part 210 has a pattern having a circular plate shape and a pattern having a concentric circle shape. The finger part 220 is connected to the pad part 220 and has a pattern linearly extending from the pad part 210. The pad part 210 has a plurality of concentric circle-shaped patterns spaced from each other, and at least portion of the pad part 210 and the finger part 220 have the same pattern width as each other.

In the present embodiment, the finger part 220 is provided in plurality, and at least one of the finger part 220 extends from the pad part 210 in a direction in which the at least one is at right angles to the other one.

The pad part 210 includes openings between the pattern having the circular plate shape and the pattern having the concentric circle shape to upwardly expose the conductive layer 200 through the openings.

As illustrated in FIGS. 1 to 3, the electrode pad 80 is disposed on the pad part 210. A contact area between the electrode pad 80 and the pad part 210 is increased by the pattern of the pad part 210 to improve a coupling force therebetween.

Figure 8:
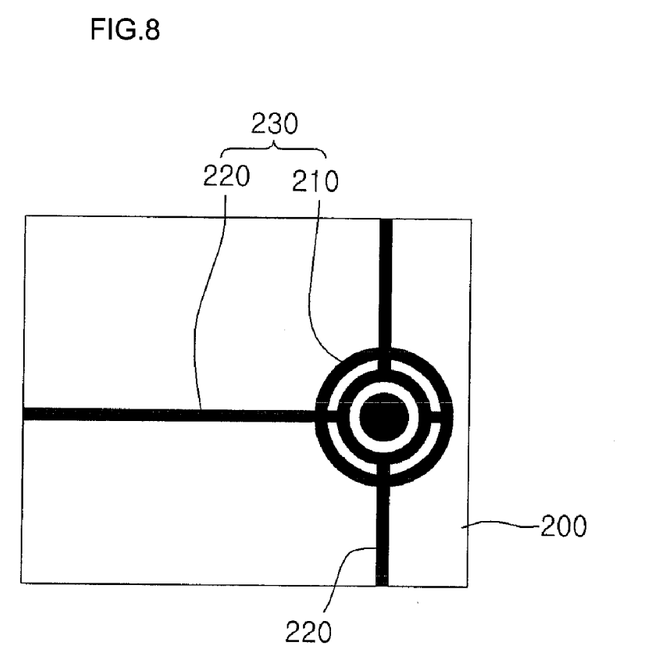
FIG. 8 is a view illustrating an electrode of a light emitting device according to a fifth embodiment.

FIG. 8 is a view illustrating an electrode of a light emitting device according to a fifth embodiment.

In descriptions of the fifth embodiment, descriptions overlapping with the first embodiment described above will be omitted.

Referring to FIG. 8, an electrode 230 including a pad part 210 and a finger part 220 is disposed on a conductive layer 200.

The pad part 210 has a pattern having an approximately circular plate shape and a pattern having a concentric circle shape, and the finger part 220 is connected to the pad part 210 and has a pattern linearly extending from the pad part 210. The pad part 210 has a plurality of concentric circle-shaped patterns partially connected to each other and a circular plate-shaped pattern. At least portion of the pad part 210 and the finger part 220 have the same pattern width as each other.

In the present embodiment, the finger part 220 is provided in plurality, and at least one extends from the pad part 210 in a direction in which the at least one is at right angles to the other one.

The pad part 210 includes openings between the pattern having the concentric circle shape and the pattern having the circular plate shape to upwardly expose the conductive layer 200 through the openings.

As illustrated in FIGS. 1 to 3, the electrode pad 80 is disposed on the pad part 210. A contact area between the electrode pad 80 and the pad part 210 is increased by the pattern of the pad part 210 to improve a coupling force therebetween.

Figure 9:
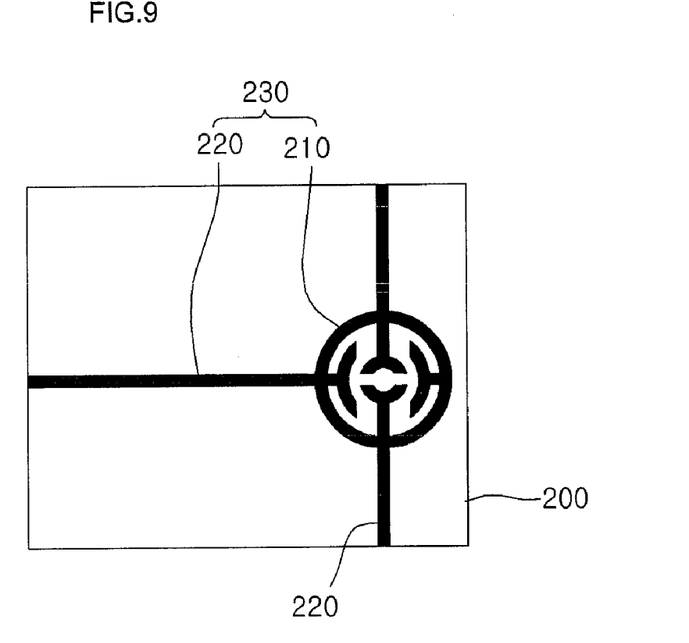
FIG. 9 is a view illustrating an electrode of a light emitting device according to a sixth embodiment.

FIG. 9 is a view illustrating an electrode of a light emitting device according to a sixth embodiment.

In descriptions of the sixth embodiment, descriptions overlapping with the first embodiment described above will be omitted.

Referring to FIG. 9, an electrode 230 including a pad part 210 and a finger part 220 is disposed on a conductive layer 200.

The pad part 210 has an approximately circular pattern, and the finger part 220 is connected to the pad part 210 and has a pattern linearly extending from the pad part 210. The pad part 210 has the circular pattern, and a portion of the pad part 210 extends inside the circular pattern.

At least portion of the pad part 210 and the finger part 220 have the same pattern width as each other.

In the present embodiment, the finger part 220 is provided in plurality, and at least one extends from the pad part 210 in a direction in which the at least one is at right angles to the other one.

The pad part 210 includes an opening within the circular pattern to upwardly expose the conductive layer 200 through the opening.

As illustrated in FIGS. 1 to 3, the electrode pad 80 is disposed on the pad part 210. A contact area between the electrode pad 80 and the pad part 210 is increased by the pattern of the pad part 210 to improve a coupling force therebetween.

Figure 10:
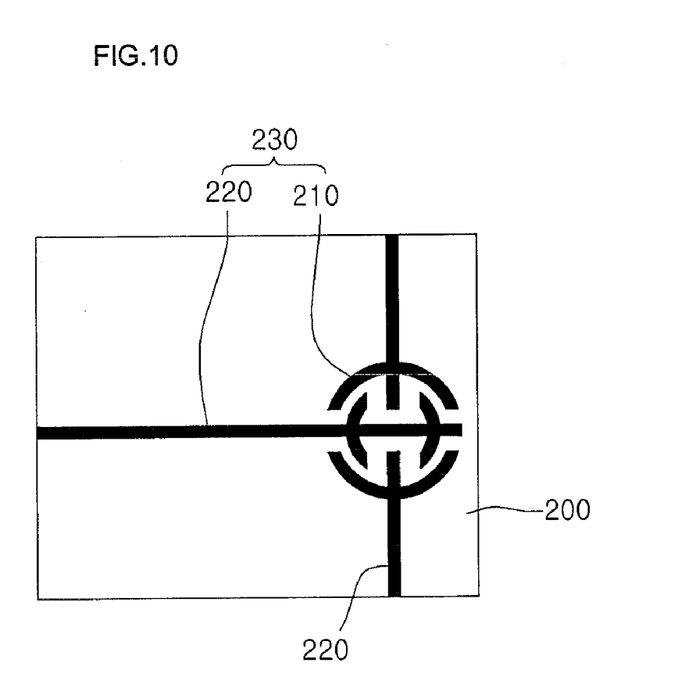
FIG. 10 is a view illustrating an electrode of a light emitting device according to a seventh embodiment.

FIG. 10 is a view illustrating an electrode of a light emitting device according to a seventh embodiment.

In descriptions of the seventh embodiment, descriptions overlapping with the first embodiment described above will be omitted.

Referring to FIG. 10, an electrode 230 including a pad part 210 and a finger part 220 is disposed on a conductive layer 200.

The pad part 210 has a plurality of patterns spaced from each other, and at least portion of the patterns has an arc shape. The finger part 220 is connected to the pad part 210 and has a pattern linearly extending from the pad part 210.

The pad parts 210 respectively connected to the finger parts 220 are separated from each other. Also, the pad part 210 and the finger part 220 have the same pattern width as each other.

In the present embodiment, the finger part 220 is provided in plurality, and at least one extends from the pad part 210 in a direction in which the at least one is at right angles to the other one.

As illustrated in FIGS. 1 to 3, the electrode pad 8 is disposed on the pad part 210. A contact area between the electrode pad 80 and the pad part 210 is increased by the pattern of the pad part 210 to improve a coupling force therebetween.

Figure 11:
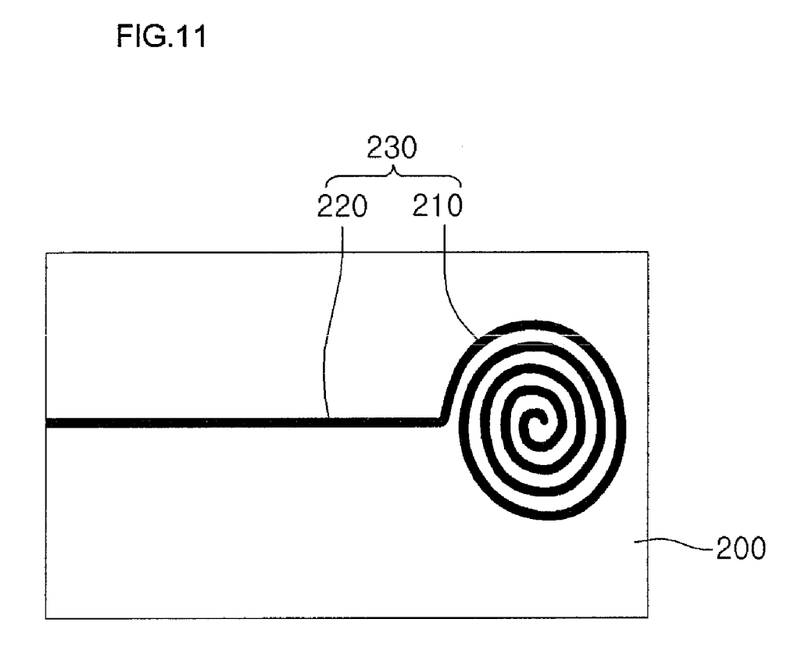
FIG. 11 is a view illustrating an electrode of a light emitting device according to an eighth embodiment.

FIG. 11 is a view illustrating an electrode of a light emitting device according to an eighth embodiment.

In descriptions of the eight embodiment, descriptions overlapping with the first embodiment described above will be omitted.

Referring to FIG. 11, an electrode 230 including a pad part 210 and a finger part 220 is disposed on a conductive layer 200.

The pad part 210 has a pattern having a spiral shape. The finger part 220 is connected to the pad part 210 and has a pattern linearly extending from the pad part 210. Also, the pad part 210 and the finger part 220 have the same pattern width as each other.

As illustrated in FIGS. 1 to 3, the electrode pad 80 is disposed on the pad part 210. A contact area between the electrode pad 80 and the pad part 210 is increased by the pattern of the pad part 210 to improve a coupling force therebetween.

Figure 12:
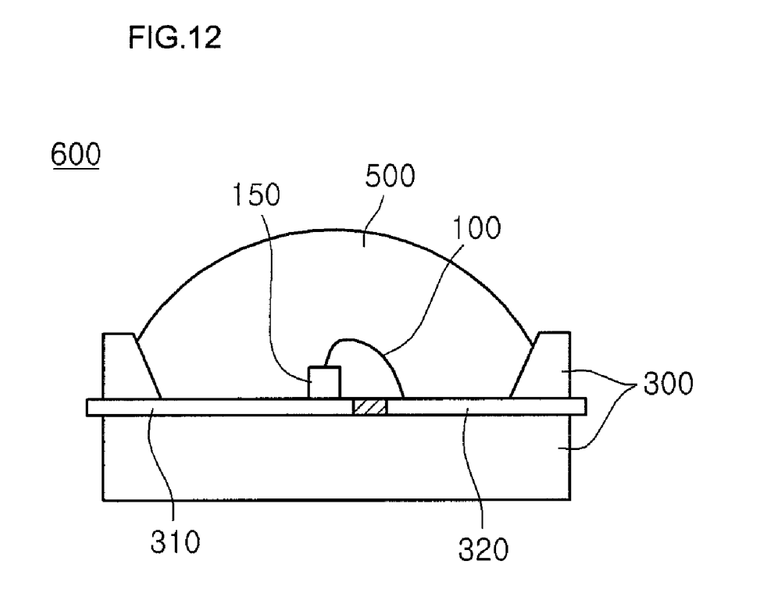
FIG. 12 is a view of a light emitting device package including the light emitting device according to the embodiments.

FIG. 12 is a view of a light emitting device package including the light emitting device according to the embodiments.

Referring to FIG. 12, a light emitting device package 600 according to an embodiment includes a package body 300, first and second electrode layers 310 and 320 disposed on the package body 300, a light emitting device 150 disposed on the package body 300 and electrically connected to the first and second electrode layers 310 and 320, and a molding member 500 surrounding the light emitting device 150.

The package body 300 may be formed of a silicon material, a synthetic resin material, or a metal material. An inclined surface may be disposed around the light emitting device 150.

The first and second electrode layers 310 and 320 are electrically separated from each other to supply a power to the light emitting device 150. Also, the first and second electrode layers 310 and 320 may reflect light generated in the light emitting device 150 to increase light efficiency. In addition, the first and second electrode layers 310 and 320 may discharge heat generated in the light emitting device 150.

The light emitting device 150 may include a lateral type light emitting device or a vertical type light emitting device. Also, the light emitting device 150 may be disposed on the package body 300 or the first or second electrode layer 310 or 320.

The light emitting device 150 may be electrically connected to the first electrode layer 310 and/or the second electrode layer 320 through a wire 100. Since the vertical-type light emitting device 150 is described as an example in the embodiment, the embodiment is illustrated to use one wire 100 as an example. Alternatively, when the light emitting device 150 includes the lateral type light emitting device as illustrated in FIGS. 1 and 2, two wires 100 may be used. Also, when the light emitting device 150 includes a flip chip type light emitting device, the wire 100 may not be used.

The molding member 500 may surround the light emitting device 150 to protect the light emitting device 150. Also, a phosphor may be contained in the molding member 500 to change a wavelength of the light emitted from the light emitting device 150.

Since the light emitting device package 600 uses the light emitting device having superior reliability due to the coupling force improved between the electrode 70 and the electrode pad 80, the light emitting device package 600 may have superior electrical property and a low defect occurrence rate.

A plurality of light emitting device packages 600 is arrayed on the substrate. Optical members such as a light guide plate, a prism sheet, a diffusion sheet, and a fluorescence sheet may be disposed on a path of the light emitted from the light emitting device package 600. The light emitting device package, the substrate, and the optical member may be functioned as a backlight unit or a light unit. For example, a lighting system may include the backlight unit, the lighting unit, an indicating device, a lamp, and a street lamp.

Figure 13:
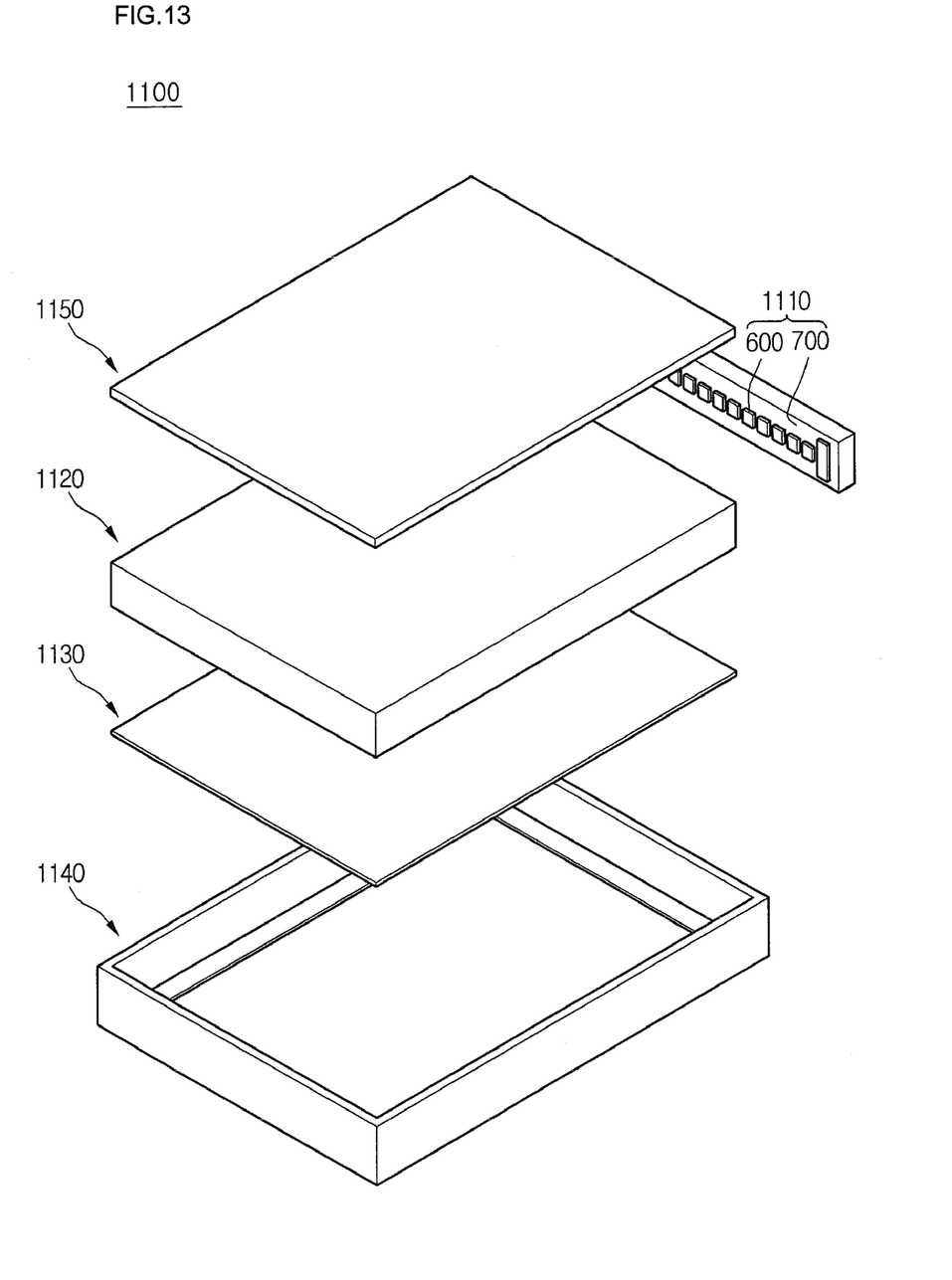
FIG. 13 is a view of a backlight unit using the light emitting device or the light emitting device package according to the embodiments.

FIG. 13 is a view of a backlight unit using the light emitting device or the light emitting device package according to the embodiments. However, the backlight unit 1100 of FIG. 13 is an example of a lighting system, and thus the present disclosure is not limited thereto.

Referring to FIG. 13, the backlight unit 1100 may include a bottom frame 1140, a light guide member 1120 disposed within the bottom frame 1140, and a light emitting module 1110 disposed on at least one side or an under surface of the light guide member 1120. Also, a reflective sheet 1130 may be disposed below the light guide member 1120.

The bottom frame 1140 may have a box shape with an opened upper side to receive the light guide member 1120, the light emitting module 1110, and the reflective sheet 1130. The bottom frame 1140 may be formed of a metal material or a resin material, but is not limited thereto.

The light emitting module 1110 may include a substrate 700 and a plurality of light emitting device packages 600 mounted on the substrate 700. The plurality of light emitting device packages 600 may provide light to the light guide member 1120. In the light emitting module 1110 according to the embodiment, although the light emitting device package 600 is disposed on the substrate 700 as an example, the light emitting device 150 according to the embodiment may be directly disposed.

As shown in FIG. 13, the light emitting module 1110 may be disposed on at least one of inner surfaces of the bottom frame 1140. Thus, the light emitting module 1110 may provide light toward at least lateral surface of the light guide member 1120.

The light emitting module 1110 may be disposed on the bottom frame 1140 to provide light toward an under surface of the light guide member 1120. This may be variously varied according to a design of the backlight unit 1150, but is not limited thereto.

The light guide member 1120 may be disposed within the bottom frame 1140. The light guide member 1120 may receive the light provided from the light emitting module 1110 to produce planar light, and then guide the planar light to a liquid crystal panel (not shown).

For example, the light guide member 1120 may be a light guide panel (LGP). The LGP may be formed of one of a resin-based material such as polymethylmethacrylate (PMMA), a polyethylene terephthalate (PET) resin, a polycarbonate (PC) resin, a cyclic olefin copolymer (COC) resin, or a polyethylene naphthalate (PEN) resin.

An optical sheet 1150 may be disposed on the light guide member 1120.

For example, the optical sheet 1150 may include at least one of a diffusion sheet, a light collection sheet, a brightness enhancement sheet, or a fluorescence sheet. For example, the diffusion sheet, the light collection sheet, the brightness enhancement sheet, and the fluorescence sheet may be stacked to form the optical sheet 1150. In this case, the diffusion sheet may uniformly diffuse light emitted from the light emitting module 1110, and the diffused light may be collected into the display panel (not shown) by the light collection sheet. Here, the light emitted from the light collection sheet is randomly polarized light. The brightness enhancement sheet may enhance a degree of polarization of the light emitted from the light collection sheet. For example, the light collection sheet may be a horizontal and/or vertical prism sheet. Also, the brightness enhancement sheet may be a dual brightness enhancement film. The fluorescence sheet may be a light transmitting plate or film containing a phosphor.

The reflective sheet 1130 may be disposed under the light guide member 1120. The reflective sheet 1130 reflects the light emitted through the under surface of the light guide member 1120 toward a light emitting surface of the light guide member 1120.

The reflective sheet 1130 may be formed of a material having superior reflectance, e.g., a PET resin, a PC resin, or a PVC resin, but is not limited thereto.

Figure 14:
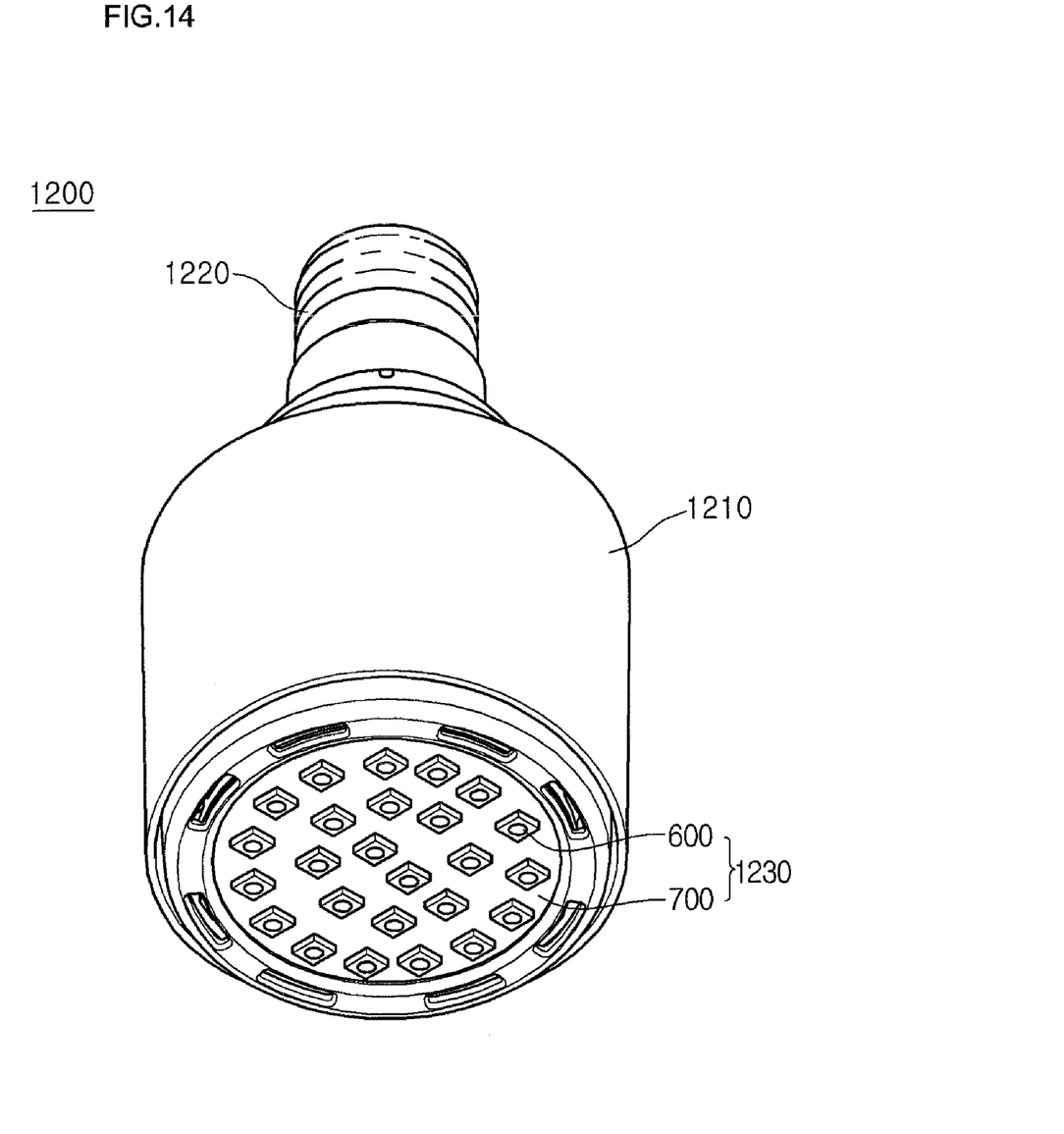
FIG. 14 is a view of a lighting unit using the light emitting device or the light emitting device package according to the embodiments.

FIG. 14 is a view of a lighting unit using the light emitting device or the light emitting device package according to the embodiments. However, the lighting unit 1200 of FIG. 14 is an example of the lighting system, and thus the present disclosure is not limited thereto.

Referring to FIG. 14, the lighting unit 1200 may include a case body 1310, a light emitting module 1230 disposed on the case body 1310, a connection terminal 1320 disposed on the case body 1310 to receive a power from an external power source.

The case body 1310 may be formed of a material having good thermal dissipation properties, e.g., a metal material or a resin material.

The light emitting module 1230 may include a substrate 700 and at least one light emitting device package 600 mounted on the substrate 700. In the light emitting module 1230 according to the embodiment, although the light emitting device package 600 is disposed on the substrate 700 as an example, the light emitting device 150 according to the embodiment may be directly disposed.

A circuit pattern may be printed on a dielectric to form the substrate 700. For example, the substrate 700 may include a printed circuit board (PCB), a metal core PCB, a flexible PCB, or a ceramic PCB.

Also, the substrate 700 may be formed of an effectively reflective material or have a color on which light is effectively reflected from a surface thereof, e.g., a white color or a silver color.

At least one light emitting device package 600 may be mounted on the substrate 700. The light emitting device package 600 may include at least one light emitting diode (LED). The LED may include colored LEDs, which respectively emit light having a red color, a green color, a blue color, and a white color and an ultraviolet (UV) LED emitting UV rays.

The light emitting module 1230 may have various combinations of the LED to obtain color impression and brightness. For example, the white LED, the red LED, and the green LED may be combined with each other to secure a high color rendering index (CRI). Also, a fluorescence sheet may be further disposed on a path of light emitted from the light emitting module 1230. The fluorescence sheet changes a wavelength of the light emitted from the light emitting module 1230. For example, when the light emitted from the light emitting module 1230 has a blue wavelength band, the fluorescence sheet may include a yellow phosphor. Thus, the light emitted from the light emitting module 1230 passes through the fluorescence sheet to finally emit white light.

The connection terminal 1320 may be electrically connected to the light emitting module 1230 to provide a power to the light emitting module 1230. Referring to FIG. 14, the connection terminal 1320 is screw-coupled to an external power source in a socket manner, but is not limited thereto. For example, the connection terminal 1320 may have a pin shape, and thus, be inserted into the external power source. Alternatively, the connection terminal 1320 may be connected to the external power source by a wire.

As described above, in the lighting system, at least one of the light guide member, the diffusion sheet, the light collection sheet, the brightness enhancement sheet, and the fluorescence sheet may be disposed on the path of the light emitted from the light emitting module to obtain a desired optical effect.

Since the lighting system uses the light emitting device having superior reliability due to the coupling force improved between the electrode 70 and the electrode pad 80, the light emitting device package 600 may have superior electrical property and a low defect occurrence rate.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a light emitting structure layer including a first conductive semiconductor layer, an active layer and a second conductive semiconductor layer; and
    an electrode including a pad part and a finger part on the light emitting structure layer, wherein the pad part includes a pattern having a spiral shape, and the finger part comprises a pattern electrically connected to the pad part and linearly extending from the pad part.

2. The light emitting device of claim 1, wherein the electrode is disposed on at least one of the first conductive type semiconductor layer and the second conductive type semiconductor layer.

3. The light emitting device of claim 1, wherein a transparent electrode layer on at least portion between the electrode and the light emitting structure layer.

4. The light emitting device of claim 1, wherein the pad part and the finger part have the same pattern width as each other.

5. The light emitting device of claim 1, comprising an electrode pad on the pad part.

* * * * *